(12) United States Patent
Ikegaya et al.

(10) Patent No.: US 12,087,703 B2
(45) Date of Patent: Sep. 10, 2024

(54) SEMICONDUCTOR DEVICE AND IN-VEHICLE ELECTRONIC CONTROL DEVICE USING THE SAME

(71) Applicant: Hitachi Astemo, Ltd., Hitachinaka (JP)

(72) Inventors: Katsumi Ikegaya, Hitachinaka (JP); Takayuki Oshima, Hitachinaka (JP); Yoichiro Kobayashi, Hitachinaka (JP); Masato Kita, Hitachinaka (JP); Keishi Komoriyama, Hitachinaka (JP); Minoru Migita, Hitachinaka (JP); Yu Kawagoe, Hitachinaka (JP); Kiyotaka Kanno, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 597 days.

(21) Appl. No.: 17/293,617

(22) PCT Filed: Nov. 27, 2019

(86) PCT No.: PCT/JP2019/046273
§ 371 (c)(1),
(2) Date: May 13, 2021

(87) PCT Pub. No.: WO2020/116263
PCT Pub. Date: Jun. 11, 2020

(65) Prior Publication Data
US 2022/0020702 A1    Jan. 20, 2022

(30) Foreign Application Priority Data

Dec. 4, 2018  (JP) .................. 2018-227408

(51) Int. Cl.
*H01L 23/528* (2006.01)
*B60R 16/03* (2006.01)
(Continued)

(52) U.S. Cl.
CPC ............ *H01L 23/562* (2013.01); *B60R 16/03* (2013.01); *H01L 21/823475* (2013.01);
(Continued)

(58) Field of Classification Search
CPC ........... H01L 23/562; H01L 21/823475; H01L 23/522; H01L 23/5226; H01L 23/5283;
(Continued)

(56) References Cited

U.S. PATENT DOCUMENTS

| | | | | |
|---|---|---|---|---|
| 4,199,733 A | * | 4/1980 | Schade, Jr. ........... | H01L 27/088 257/E27.06 |
| 2002/0056885 A1 | * | 5/2002 | Kita ....................... | H01L 24/06 257/355 |

(Continued)

FOREIGN PATENT DOCUMENTS

| | | |
|---|---|---|
| JP | 2003-100899 A | 4/2003 |
| JP | 2007-258418 A | 10/2007 |

(Continued)

OTHER PUBLICATIONS

International Search Report (PCT/ISA/210) issued in PCT Application No. PCT/JP2019/046273 dated Mar. 24, 2020 with English translation (four (4) pages).

(Continued)

*Primary Examiner* — Britt D Hanley
*Assistant Examiner* — Victor V Barzykin
(74) *Attorney, Agent, or Firm* — Crowell & Moring LLP (57) ABSTRACT

In a semiconductor device equipped with a current mirror circuit, a highly reliable semiconductor device capable of suppressing a change in a mirror ratio of the current mirror circuit over time is provided. A current mirror circuit that includes a first MOS transistor and a plurality of MOS transistors paired with the first MOS transistor, and a plurality of wiring layers formed on an upper layer of the MOS (Continued)

transistor are provided. The plurality of wiring layers are arranged such that wiring patterns have the same shape within a predetermined range from an end of a channel region of each of the first MOS transistor and the plurality of MOS transistors.

12 Claims, 11 Drawing Sheets

(51) Int. Cl.
*H01L 21/8234* (2006.01)
*H01L 23/00* (2006.01)
*H01L 23/522* (2006.01)
*H01L 27/088* (2006.01)

(52) U.S. Cl.
CPC ........ *H01L 23/522* (2013.01); *H01L 23/5226* (2013.01); *H01L 23/5283* (2013.01); *H01L 23/5286* (2013.01); *H01L 27/088* (2013.01)

(58) Field of Classification Search
CPC ..... H01L 23/5286; H01L 27/08; B60R 16/03; G05F 3/262
See application file for complete search history.

(56) References Cited

U.S. PATENT DOCUMENTS

| | | |
|---|---|---|
| 2003/0057476 A1 | 3/2003 | Morita et al. |
| 2007/0170591 A1 | 7/2007 | Yamanoue et al. |
| 2008/0079481 A1 | 4/2008 | Tomita |
| 2008/0121881 A1 | 5/2008 | Kaneko et al. |
| 2008/0265335 A1* | 10/2008 | Ryu .................... H01L 27/0207 257/E21.177 |
| 2011/0298059 A1* | 12/2011 | Huang ............ H01L 21/823437 257/E27.06 |
| 2012/0056274 A1* | 3/2012 | Yoshimura .......... H01L 27/0207 257/E27.06 |

FOREIGN PATENT DOCUMENTS

| | | |
|---|---|---|
| JP | 2008-198784 A | 8/2008 |
| JP | 2008-277833 A | 11/2008 |

OTHER PUBLICATIONS

Japanese-language Written Opinion (PCT/ISA/237) issued in PCT Application No. PCT/JP2019/046273 dated Mar. 24, 2020 (four (4) pages).

German-language Office Action issued in German Application No. 11 2019 005 134.2 dated Jan. 27, 2024 with English translation (12 pages).

* cited by examiner

TWO-DIMENSIONAL SIMULATION MODEL (CROSS-SECTIONAL VIEW)
Al WIRING Line/Space=0.3um/0.3um, 17 WIRINGS

TWO-DIMENSIONAL SIMULATION MODEL (CROSS-SECTIONAL VIEW)
Al WIRING Line/Space=0.3um/0.3um, 17 WIRINGS

SEMICONDUCTOR DEVICE AND IN-VEHICLE ELECTRONIC CONTROL DEVICE USING THE SAME

TECHNICAL FIELD

The present invention relates to a structure of a semiconductor device configured by using a multilayer wiring technique, and particularly relates to a technique effective when applied to a semiconductor device including a current mirror circuit.

BACKGROUND ART

The current mirror circuit, which is often used in analog integrated circuits, converts the input current to a desired magnification (mirror ratio) according to the size of the MOS transistors on the input side and the output side and outputs the current. In order to operate the semiconductor circuit device using the current mirror circuit with high accuracy, it is required to reduce the variation in the pairing of the transistors constituting the current mirror circuit and to suppress the variation of the pairing over time.

Further, in a semiconductor integrated circuit device, metal wirings for connecting elements such as transistors, diodes, resistors, and capacitances are usually formed on these elements. The wiring pattern is formed by repeating the film formation and pattern formation of metal films and insulating films. Due to the difference in the linear expansion coefficient between the metal films, the insulating films, and the semiconductor substrate, thermal strain may occur in the wiring pattern, which may affect the change in element characteristics arranged around the wiring pattern over time.

As a technique for reducing the change of the elements over time due to the wiring pattern, for example, there is a technique as described in PTL 1. PTL 1 is a technique for reducing the influence of a dummy wiring on a MOS transistor by defining the arrangement of dummy wiring on the upper layer of the MOS transistor.

PTL 1 states that "a semiconductor device having a dummy wiring for mechanical chemical polishing averaging arranged on an upper layer of a transistor, wherein the dummy wiring does not overlap any of the pairing transistors in plan view or is arranged such that a portion overlapping a first transistor and the second transistor are equivalent in the first transistor and the second transistor".

CITATION LIST

Patent Literature

PTL 1: JP 2003-100899 A

SUMMARY OF INVENTION

Technical Problem

By the way, in the analog integrated circuit, the current generated by a reference current source is copied to each circuit block by using the current mirror circuit. The current mirror circuit is configured by a plurality of transistors, and such a current mirror circuit is often mounted one-dimensionally or two-dimensionally in an array in a semiconductor integrated circuit.

In order to control the analog integrated circuit with high accuracy, it is required to reduce the initial variation of the pairing and suppress the deterioration of the pairing over time for all the transistors constituting the current mirror circuit.

One of the factors that deteriorate the pairing of the transistor is the thermal strain of the transistor due to the thermal stress of the wiring pattern. As a result of analyzing the influence of the thermal strain of the wiring pattern by simulation and actual measurement, the inventors of the present application have confirmed that the change in strain is particularly large in the vicinity of the end of the wiring of about 5 μm to 10 μm in the wide wiring. It has been also confirmed that the change in strain is similarly large in the vicinity of the end of the wiring region when a plurality of thin wirings are densely arranged.

In other words, in order to reduce the variation in thermal strain, it has been found that it is necessary to consider the arrangement of the transistors and the wirings not only directly under the wiring but also in the peripheral region of the wiring.

The thermal strain of the above wiring pattern changes due to the repetition of high-temperature and low-temperature thermal stress when a semiconductor integrated circuit is used. Therefore, if the wiring pattern around each transistor constituting the current mirror circuit is different, the pairing of the transistors changes over time, and the circuit characteristics are deteriorated.

In particular, an in-vehicle semiconductor integrated circuit device requires highly accurate control of power transistors that drive actuators such as solenoids. Further, since it is used in an environment where thermal stress is large, from −40° C. or lower to 150° C. or higher, the circuit characteristics may deteriorate due to the influence of the thermal strain of the above wiring.

Figure 4:
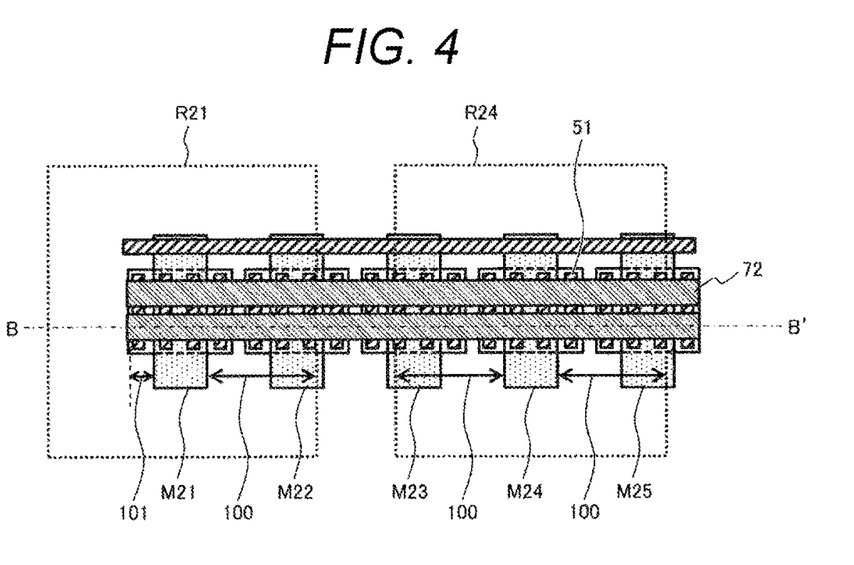
FIG. 4 is a plan view of a conventional semiconductor device.
Figure 5:
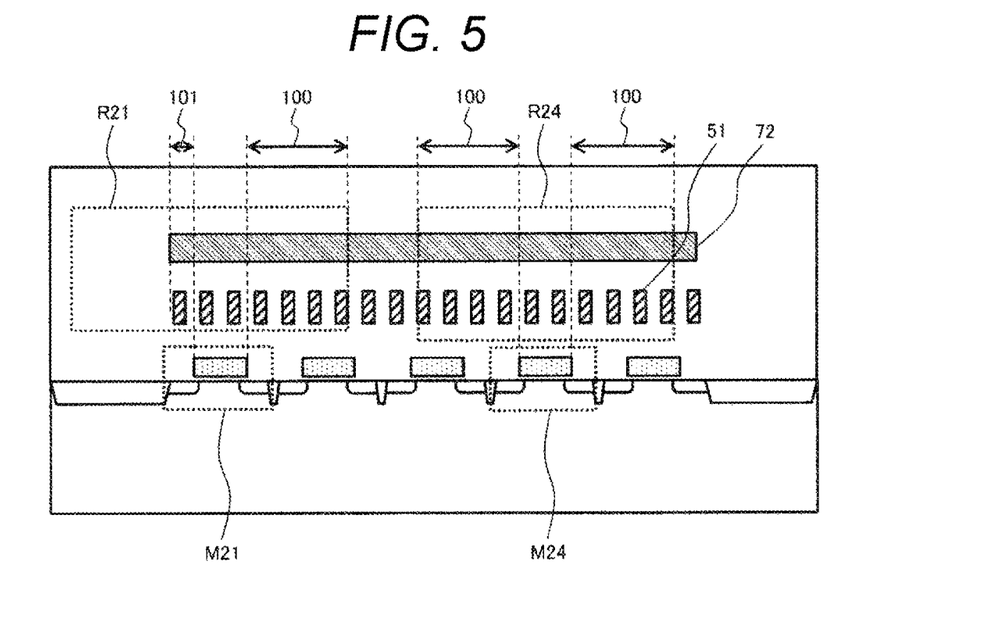
FIG. 5 is a cross-sectional view taken along line B-B' of FIG. 4.

The above-mentioned PTL 1 defines a wiring pattern on a MOS transistor, and describes a method of suppressing variation and aging deterioration in pairing of MOS transistors. However, when three or more MOS transistors are arranged in an array and a wiring pattern is arranged on each MOS transistor as illustrated in FIGS. 4 and 5 described later, the MOS transistors near the center of the array and the MOS transistors at the end of the array have a different wiring pattern diagonally above the MOS transistor. Therefore, the influence of the thermal strain of the wiring differs between the vicinity of the center and the end of the MOS transistor array, and the initial pairing ratio and the pairing ratio fluctuate.

Therefore, an object of the invention is to provide a semiconductor device equipped with a current mirror circuit, which has high reliability capable of suppressing a change in a mirror ratio of the current mirror circuit over time.

Specifically, a technology is provided in a current mirror circuit in which three or more MOS transistors are arranged, the thermal strain of the MOS transistor near the center and the MOS transistor at the end of the arrangement are made equal to suppress the deterioration of the mirror ratio of the current mirror circuit over time.

Solution to Problem

In order to solve the above problems, a current mirror circuit according to the invention includes a first MOS transistor and a plurality of MOS transistors paired with the first MOS transistor, and a plurality of wiring layers formed on an upper layer of the MOS transistor are provided. The plurality of wiring layers are arranged such that wiring patterns have the same shape within a predetermined range from an end of a channel region of each of the first MOS transistor and the plurality of MOS transistors.

Advantageous Effects of Invention

According to the invention, in a semiconductor device equipped with a current mirror circuit, a highly reliable semiconductor device capable of suppressing a change in a mirror ratio of the current mirror circuit over time can be realized.

Specifically, the thermal stress received from the wiring by each MOS transistor constituting the current mirror circuit becomes equal, and the change in MOS characteristics over time due to the stress becomes equal for each transistor, so that the pairing of the transistors is ensured, and the fluctuation of the mirror ratio is suppressed.

Objects, configurations, and effects besides the above description will be apparent through the explanation on the following embodiments.

DESCRIPTION OF EMBODIMENTS

Hereinafter, embodiments of the invention will be described using the drawings. In the drawings, the same configurations are denoted by the same reference numerals, and detailed description of overlapping portions will be omitted.

First Embodiment

Figure 1:
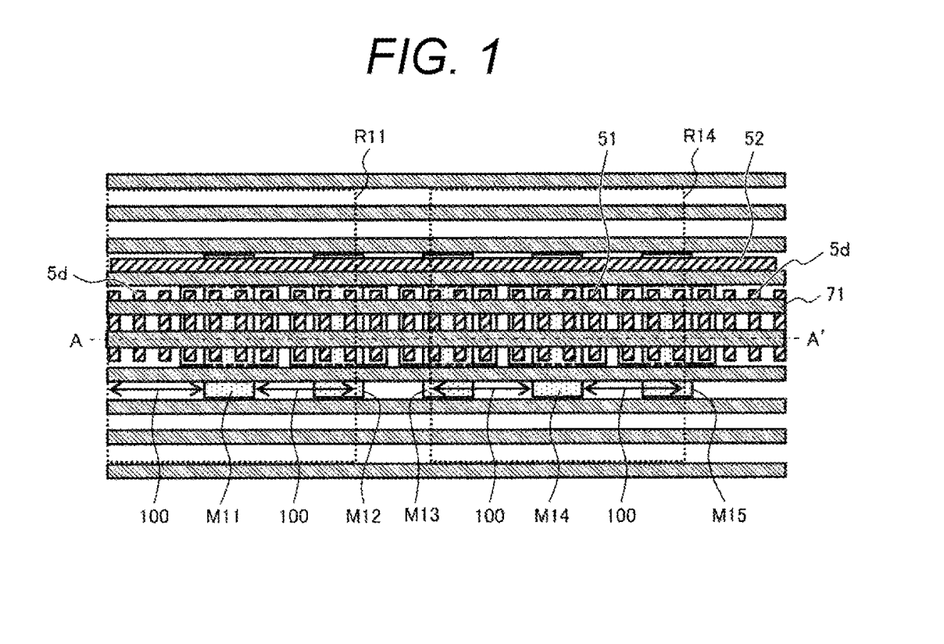
FIG. 1 is a plan view of a semiconductor device according to a first embodiment of the invention.
Figure 2:
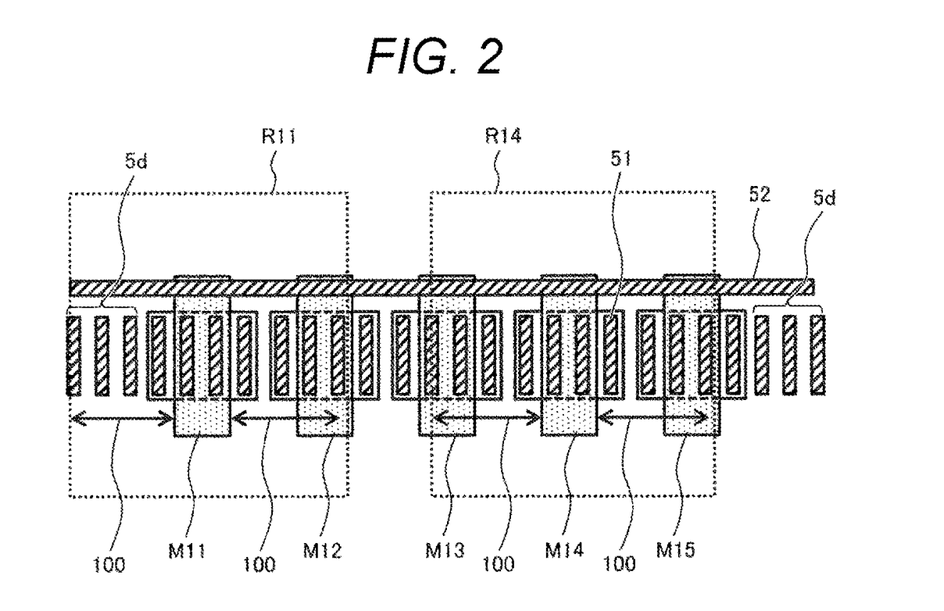
FIG. 2 is a plan view of the semiconductor device according to the first embodiment of the invention.
Figure 3:
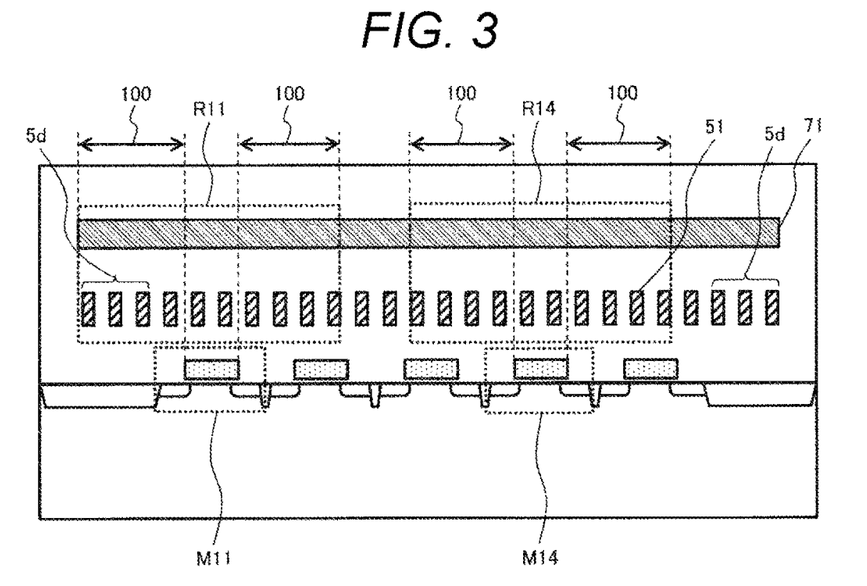
FIG. 3 is a cross-sectional view taken along line A-A of FIG. 1.

A semiconductor device according to a first embodiment of the invention will be described with reference to FIGS. 1 to 6B. FIG. 1 is a plan view of a semiconductor device to which the invention is applied. An array of MOS transistors M11 to M15 that make up a current mirror circuit, a first wiring layer 51 for connecting sources or drains extending in the gate width direction (vertical direction in FIG. 1) of the MOS transistors, a first wiring layer 52 for connecting gates, and a first wiring layer 5d which is a dummy wiring around the MOS transistor array are arranged, and a second wiring layer 71 is arranged in the gate length direction. In FIG. 2, the second wiring layer 71 is excluded in order to explain the shapes of the MOS transistors M11 to M15 of FIG. 1 and the first wiring layers 51, 52, and 5d. Further, FIG. 3 is a cross-sectional view of the semiconductor device of FIG. 1 cut at A-A'. In order to make the structure easier to understand, the contact pattern connecting the MOS transistors M11 to M15 and the first wirings 51, 52, and 5d are not illustrated in FIGS. 1, 2, and 3.

Figure 6A:
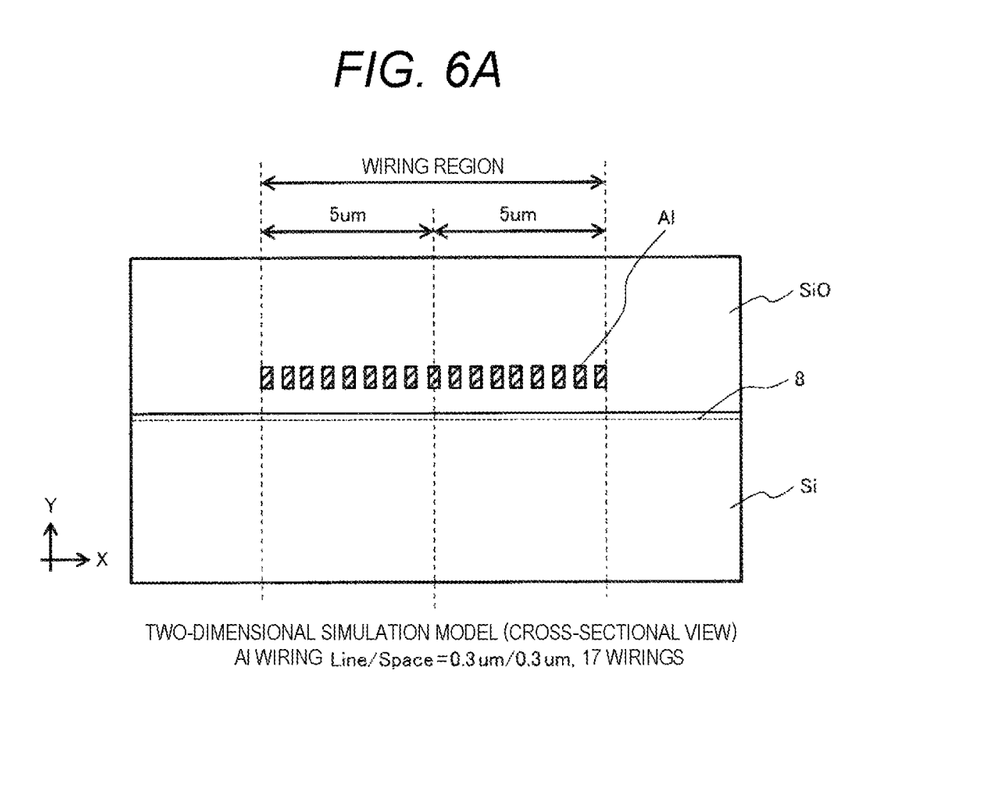
FIG. 6A is a diagram illustrating a simulation model of the amount of thermal strain on a transistor surface under wiring.
Figure 6B:
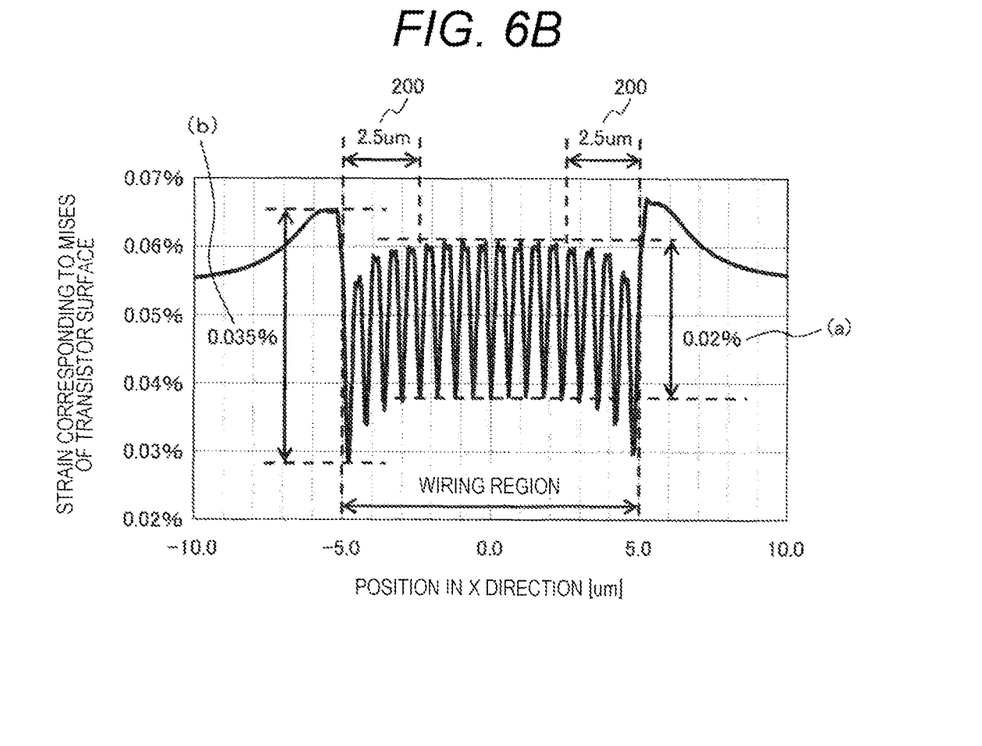
FIG. 6B is a diagram illustrating a simulation result of the amount of thermal strain on the transistor surface under wiring.

As illustrated in FIGS. 1 to 3, stress simulations when a plurality of wiring patterns are arranged at a specific pitch are illustrated in FIGS. 6A and 6B. FIG. 6A is a two-dimensional cross-sectional model for simulation, and FIG. 6B is the distribution of the amount of strain on a transistor surface S of FIG. 6A. As illustrated in FIG. 6A, the stress simulation has been performed using a model in which 17 Al wirings are placed in the region of −5 μm to +5 μm on a Si substrate and an Al wiring is surrounded by a silicon oxide film (SiO film).

As illustrated in FIG. 6B, the strain change (a) near the center X=0.0 μm of the wiring region is 0.02%, while the strain change is (b) about 0.035% at the ends of the wiring region near X=−5.0 μm and X=+5 μm, and the strain change near the center of the wiring region is 1.75 times larger than the strain change (a). The region where the strain at the end of the wiring region changes significantly extends to about 2.5 μm (distance indicated by Symbol 200) on the wiring region side. Therefore, when arranging the wiring on the transistor, in order to suppress the influence of strain that the transistor receives from the wiring pattern, it is necessary to arrange the transistors to be separated from the end of the wiring region by about 2.5 μm (distance indicated by Symbol 200) in plan view.

FIGS. 4 and 5 are conventional examples of wiring patterns of the MOS transistor array constituting the current mirror circuit. FIG. 5 is a cross-sectional view taken along line B-B' of FIG. 4.

In FIGS. 4 and 5, the wiring patterns arranged directly above each MOS transistor are the same for the MOS transistors M21 to M25. However, the MOS transistor M21 at the left end of FIG. 4 has a wiring pattern only up to the distance indicated by Symbol 101 on the left side in plan view from the channel region of the MOS transistor. When a distance 101 is shorter than a distance 200 in FIG. 6B, the wiring pattern is different between R21 and R24 in the region where the M21 at the left end and the M24 near the center are affected by the strain due to the wiring, respectively.

Therefore, the MOS transistor M21 and the MOS transistor M24 have different changes in electrical characteristics due to changes in strain over time, the pairing of the MOS transistor M21 and the MOS transistor M24 may change, and the mirror ratio of the current mirror circuit may change.

Therefore, in the semiconductor device of this embodiment, as illustrated in FIGS. 1 to 3, the wiring 5d that is a dummy wiring is added from the channel region of the transistor M11 at the left end of the MOS transistor array to the distance 100 on the left side of the array in plan view. Similarly, the wiring 5d that is a dummy wiring is added from the channel region of the transistor M15 on the right end of the MOS transistor array to the distance 100 on the right side of the array in plan view.

That is, by making the distance 100 larger than the distance 200 (2.5 μm) illustrated in FIG. 6B, the region where the change in strain becomes large at the end of the wiring region is prevented from being applied to the channels of the MOS transistors M11 and M15.

As described above, the semiconductor device of this embodiment includes a first MOS transistor M11 (or M15), a current mirror circuit which is paired with the first MOS transistor M11 (or M15) and has a plurality of MOS transistors M12 to M14, and a plurality of wiring layers (the first wiring layers 51 and 5d, and the second wiring layer 71) formed in the upper layer of the current mirror circuit (MOS transistors M11 to M15). The plurality of wiring layers (the first wiring layers 51 and 5d, and the second wiring layer 71) are arranged such that the wiring patterns each have the same shape in predetermined ranges R11 and R14 from the channel region of the MOS transistors (the first MOS transistor M11 (or M15) and the plurality of MOS transistors M12 to M14).

Further, the predetermined range is a range in which the distance from the end of the channel region of each of the MOS transistors M11 to M15 is within 5 μm.

Further, the wiring 5d, which is a dummy wiring, is arranged within a predetermined range (within a distance of 5 μm or less) from the end of the channel region of the MOS transistor M11 (or M15) arranged at the end of the current mirror circuit.

As a result, the first wiring layers 51, 52, and 5d and the second wiring layer 71 have the same shape in the regions R11 and R14 in which the MOS transistor M11 at the left end and the MOS transistor M14 near the center of FIG. 1 are subject to wiring strain. Therefore, the amount of strain of the MOS transistor M11 and that of the MOS transistor M14 are the same, and the change in electrical characteristics due to the change in strain over time is also the same. Therefore, the change in mirror ratio over time can be suppressed. The same applies to the MOS transistor M15 at the right end.

When the semiconductor device of this embodiment is adopted as, for example, an in-vehicle current control analog integrated circuit device, and the current mirror circuit is used for current value measurement, the accumulation of thermal strain due to the repetition of low temperature (stop) and high temperature (drive) can be made equal for the MOS transistors constituting the current mirror circuit. Therefore, the change in the characteristics of each MOS transistor over time can be relatively eliminated, and the fluctuation of the mirror ratio can be suppressed. This enables highly reliable current control.

Second Embodiment

Figure 7:
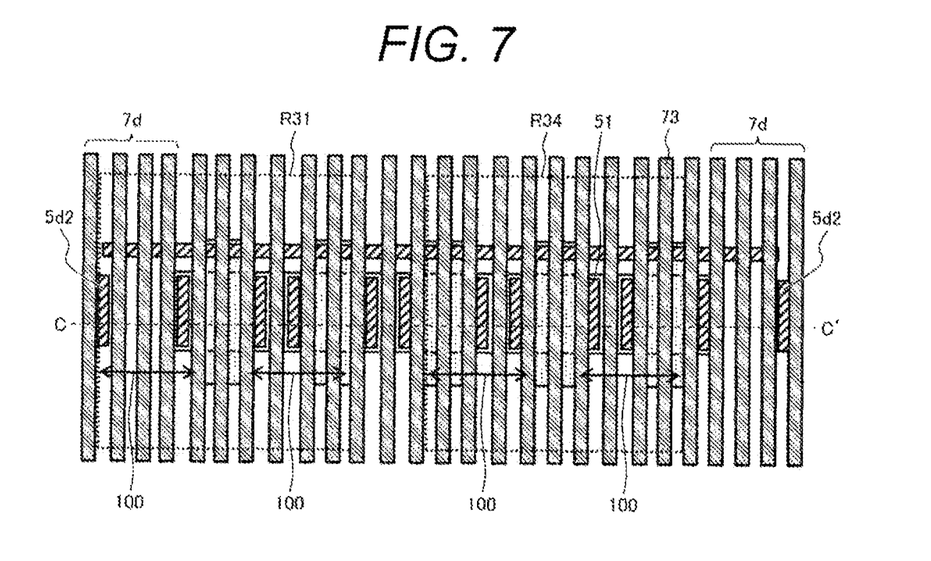
FIG. 7 is a plan view of the semiconductor device according to a second embodiment of the invention.
Figure 8:
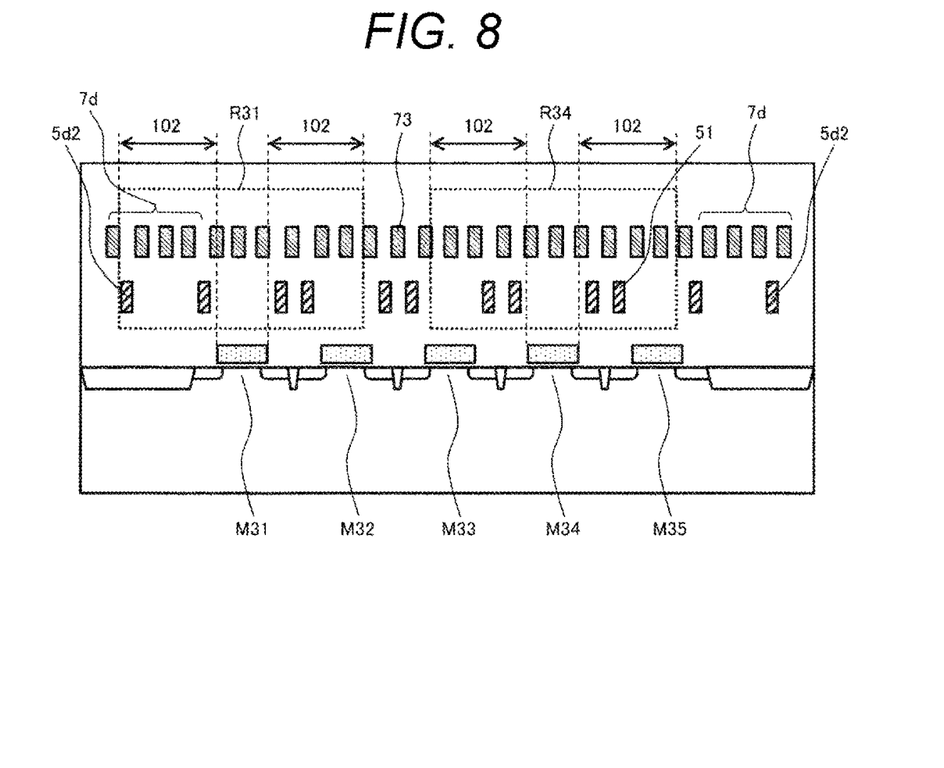
FIG. 8 is a cross-sectional view taken along line C-C' of FIG. 7.

The semiconductor device of a second embodiment of the invention will be described with reference to FIGS. 7 and 8. FIG. 7 is a plan view of a semiconductor device to which the invention is applied, and the current mirror circuit is configured by five MOS transistors as in the first embodiment (FIG. 1). FIG. 8 is a cross-sectional view of the semiconductor device of FIG. 7 cut at C-C'.

In this embodiment, the first wiring layer 51 on the MOS transistors M31 to M35 in the gate length direction is arranged only at the source terminal and the drain terminal of the MOS transistor. That is, the patterns of the wiring layer directly above the MOS transistors M31 to M35 in the predetermined ranges R31 and R34 only have the wiring connected to the terminals (source terminal and drain terminal) of the MOS transistors.

Further, a second wiring layer 73 extends in the same direction as the first wiring layer 51. The wirings 5d2 and 7d which are dummy wirings are added such that the wiring patterns in R31 in the region from the channel end of the MOS transistor M31 to the distance indicated by Symbol 102 in a plane and in R34 in the region from the channel end of M34 to the distance 102 in a plane become the same and thus the strain received from the wiring by the MOS transistor M31 at the left end of the MOS transistor array M31 to M35 is the same as that of the MOS transistor M34 near the center.

That is, by making the distance 102 larger than the distance 200 (2.5 μm) illustrated in FIG. 6B, the region where the change in strain becomes large at the end of the wiring region is prevented from being applied to the channels of the MOS transistors M31 and M35.

As described above, in the semiconductor device of this embodiment, the plurality of wiring layers (first wiring layer 51 and second wiring layer 73) include the first wiring layer 51 arranged in the layer closest to the layer where the MOS transistors M31 to M35 are formed and the second wiring layer 73 arranged in the upper layer of the first wiring layer 51 in the wiring layer on the MOS transistors M31 to M35. The dummy wirings 5d2 and 7d are arranged on both sides of the first wiring layer 51 and the second wiring layer 73.

Further, the second wiring layer 73 extends in the same direction as the first wiring layer 51.

As a result, the influence of strain on the MOS transistor M31 on the left end in FIG. 8 and the MOS transistor M34 near the center from the wiring becomes the same, and the change in electrical characteristics due to the change in strain over time becomes the same, so the change in mirror ratio over time can be suppressed. The same applies to M35 at the right end of the MOS transistor array.

Third Embodiment

Figure 9:
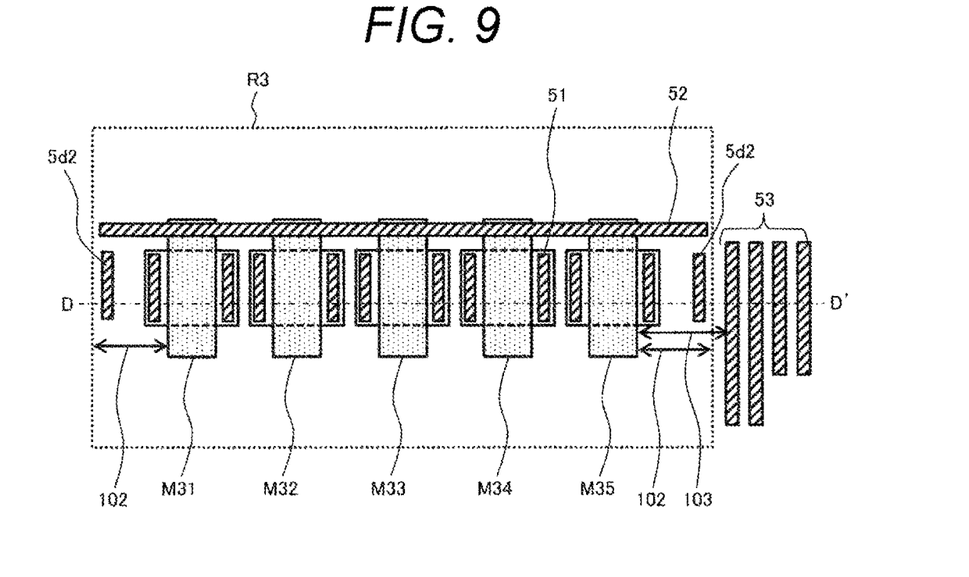
FIG. 9 is a plan view of the semiconductor device according to a third embodiment of the invention.
Figure 10:
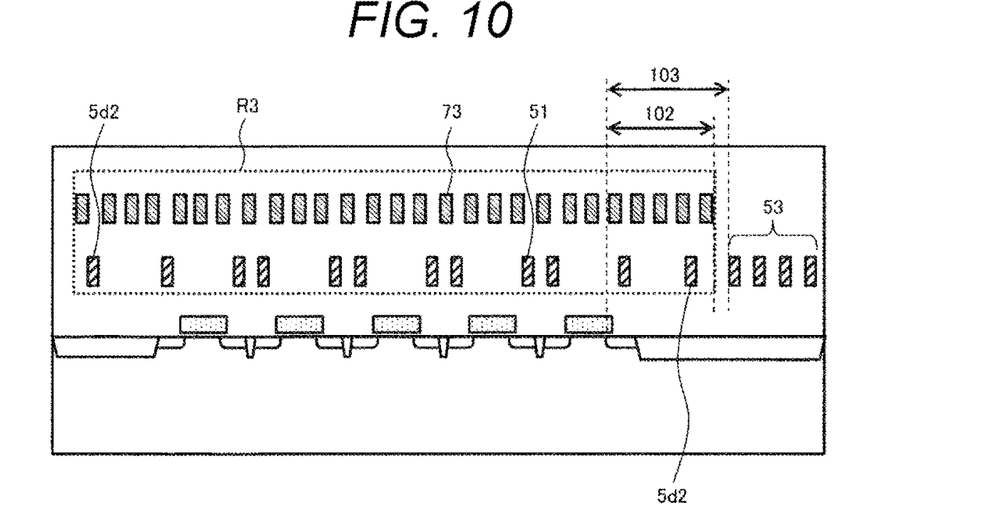
FIG. 10 is a cross-sectional view taken along line D-D' of FIG. 9.

The semiconductor device according to a third embodiment of the invention will be described with reference to FIGS. 9 to 11B. FIG. 9 is a plan view of a semiconductor device to which the invention is applied, and the current mirror circuit is configured by five MOS transistors as in the second embodiment (FIGS. 7 and 8). FIG. 10 is a cross-sectional view of the semiconductor device of FIG. 9 cut at D-D'.

In this embodiment, as illustrated in FIG. 9, a plurality of first wiring layers 53, which are dummy wirings, are added on the right side of the current mirror circuit of the second embodiment (FIG. 7). For simplicity, the second wiring layer 73 is not illustrated in FIG. 9.

In FIGS. 9 and 10, similarly to FIGS. 7 and 8, the entire region obtained by combining the regions from each channel of the MOS transistors M31 to M35 to the distance 102 in a plane is defined as R3.

In the semiconductor device of this embodiment illustrated in FIGS. 9 and 10, there are arranged a plurality of wirings 53, outside the range of the region R3, which are different in width and length from the wiring 52 for connecting the sources or drains of the MOS at intervals at positions away from the channel end of the MOS transistor M35 on the right end by a distance 103 in a plane. Here, the distance 102 the distance 103.

Figure 11A:
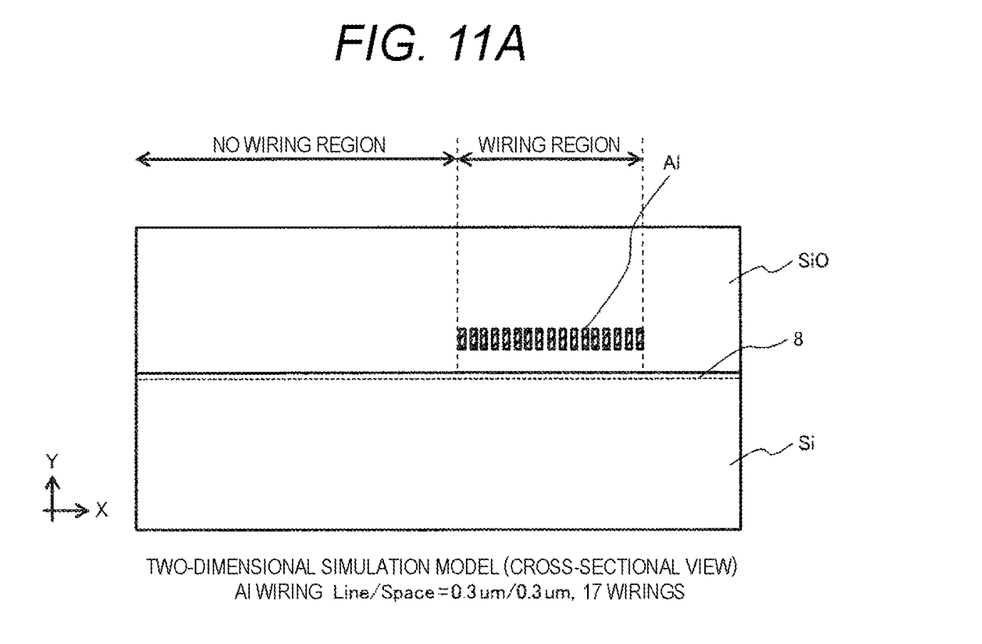
FIG. 11A is a diagram illustrating a simulation model of the amount of thermal strain of the transistor surface under the wiring and in the region having no wiring.
Figure 11B:
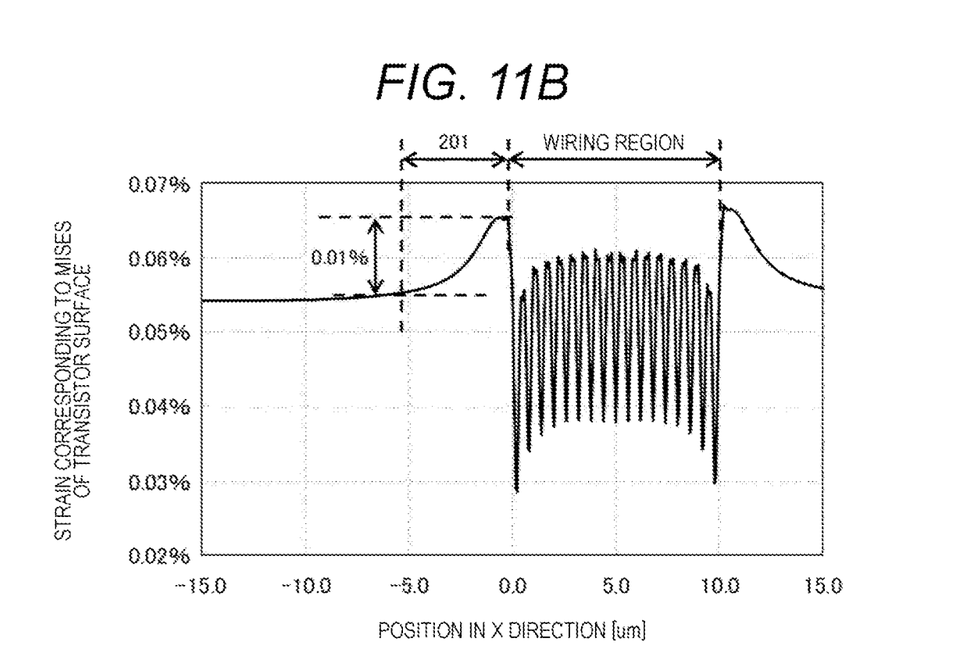
FIG. 11B is a diagram illustrating a simulation result of the amount of thermal strain on the transistor surface under the wiring and in the region having no wiring.

FIGS. 11A and 11B illustrate stress simulations when a wiring is formed at a position away from the MOS transistor array as illustrated in FIG. 9. FIG. 11A is a two-dimensional cross-sectional model for simulation, and it is considered that the MOS transistors M31 to M35 in FIG. 9 are arranged in the region having no wiring in FIG. 11A. FIG. 11B illustrates the distribution of the amount of strain on the transistor surface 8 of FIG. 11A.

As illustrated in FIG. 11B, the change in strain is large in the range of about 5.0 μm (distance indicated by Symbol 201) from the end of the wiring region to the region having no wiring. Therefore, in order to avoid the influence of strain due to the stress of the wiring, it is necessary to form the MOS transistor array constituting the current mirror circuit at a position separated from the wiring region by the distance 201 or more.

Therefore, in this embodiment, as illustrated in FIGS. 9 and 10, the wiring formed outside the range of R3 is arranged such that the distance 103 from the channel end of M35 arranged on the right end of the MOS transistor array becomes equal to or more than the distance 201 (about 5.0 μm) of FIG. 11B.

That is, a plurality of peripheral wirings 53 are arranged outside the predetermined range R3.

Further, the wiring forming each wiring pattern and the wiring for connecting the sources and drains of the MOS transistors are all formed to have the same shape.

As a result, the influence of strain due to the wiring of the transistor is suppressed, and the change in electrical characteristics of each MOS transistor is made equal, so that the change in the mirror ratio over time can be suppressed.

Fourth Embodiment

Figure 12:
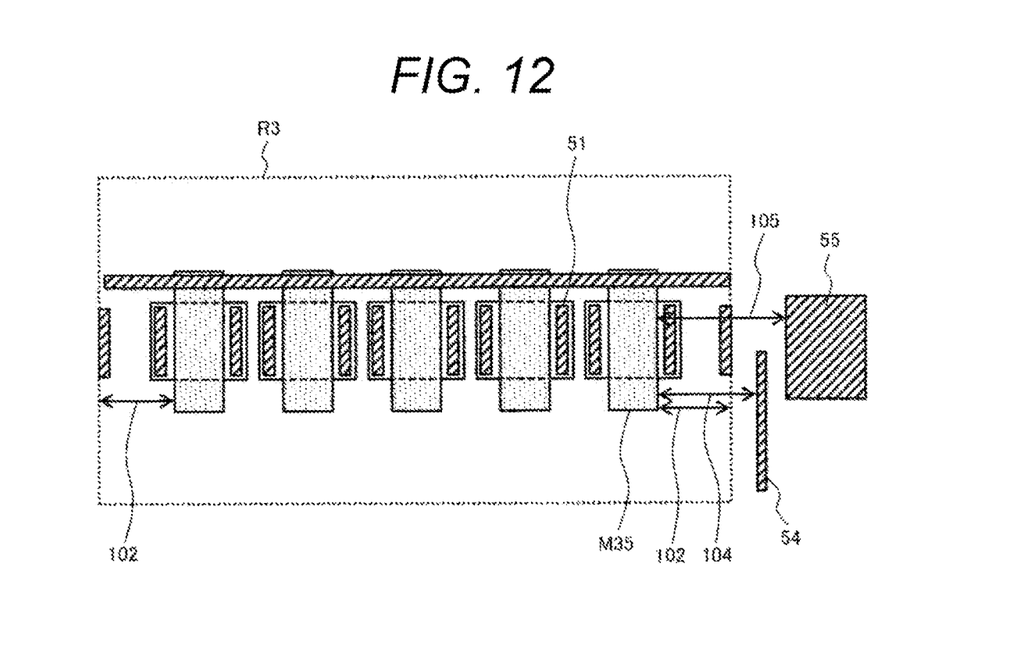
FIG. 12 is a plan view of the semiconductor device according to a fourth embodiment of the invention.

The semiconductor device according to a fourth embodiment of the invention will be described with reference to FIG. 12. FIG. 12 is a plan view of the semiconductor device to which the invention is applied.

In this embodiment, as illustrated in FIG. 12, a thin wiring 54 and a thick wiring 55 of the first wiring layer are added to the right side of the current mirror circuit of the second embodiment (FIGS. 7 and 8). For simplicity, the second wiring layer 73 is not illustrated in FIG. 12.

The region R3 in FIG. 12 is the total region in which the regions from each channel of the MOS transistors M31 to M35 to the distance 102 in a plane in FIGS. 7 and 8 are combined. The wiring 54 having a narrow wiring width is arranged, outside the range of the region R3, at a position away from the channel end of the MOS transistor M35 at the right end by a distance 104 in a plane, and the wiring 55 having a thick wiring width is arranged at a position away from the channel end of the MOS transistor M35 by a distance 105 in a plane.

A thick (wide width) wiring has a larger thermal strain than a narrow (narrow width) wiring, so the distance 105 from the channel end of the MOS transistor M35 to the thick (wide width) wiring 55 formed outside the R3 region is longer than the distance 104 to the narrow (narrow width) wiring 54 formed outside the R3 region. (Distance 104<Distance 105) That is, the plurality of peripheral wirings 54 and 55 are provided outside the predetermined range R3. The plurality of peripheral wirings 54 and 55 are arranged such that the wider the peripheral wiring is arranged, the farther away from the end of the channel region of the MOS transistor M35 which is arranged at the end of the current mirror circuit.

As a result, the strain of the MOS transistor M35 received from the thick (wide width) wiring 55 can be suppressed, and the change in electrical characteristics of each MOS can be made equal, thereby suppressing the change in the mirror ratio over time.

Fifth Embodiment

Figure 13:
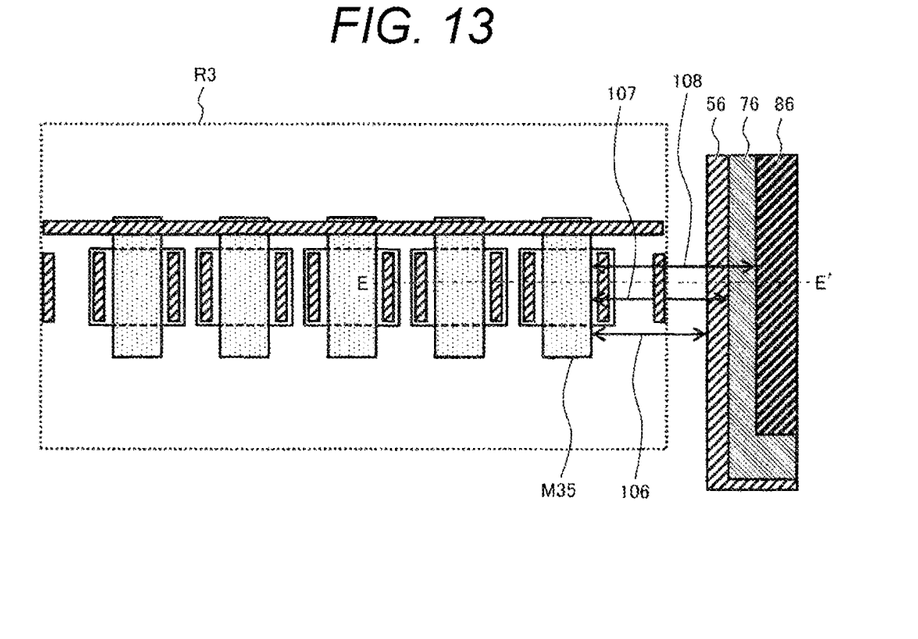
FIG. 13 is a plan view of the semiconductor device according to a fifth embodiment of the invention.

The semiconductor device of a fifth embodiment of the invention will be described with reference to FIGS. 13 and 14. FIG. 13 is a plan view of a semiconductor device to which the invention is applied, and FIG. 14 is a cross-sectional view of the semiconductor device of FIG. 13 cut by E-E'.

In this embodiment, as illustrated in FIG. 13, a first wiring layer 56, a second wiring layer 76, and a third wiring layer 86 are added to the right side of the current mirror circuit of the second embodiment (FIGS. 7 and 8). For simplicity, the second wiring layer 73 in the second embodiment (FIGS. 7 and 8) is not illustrated in FIG. 13.

The region R3 in FIG. 13 is the total region in which the regions from each channel of the MOS transistors M31 to M35 to the distance 102 in a plane in FIGS. 7 and 8 are combined. As illustrated in FIG. 14, the first wiring layer 56, the second wiring layer 76, and the third wiring layer 86 overlap partially in the vertical direction.

Figure 14:
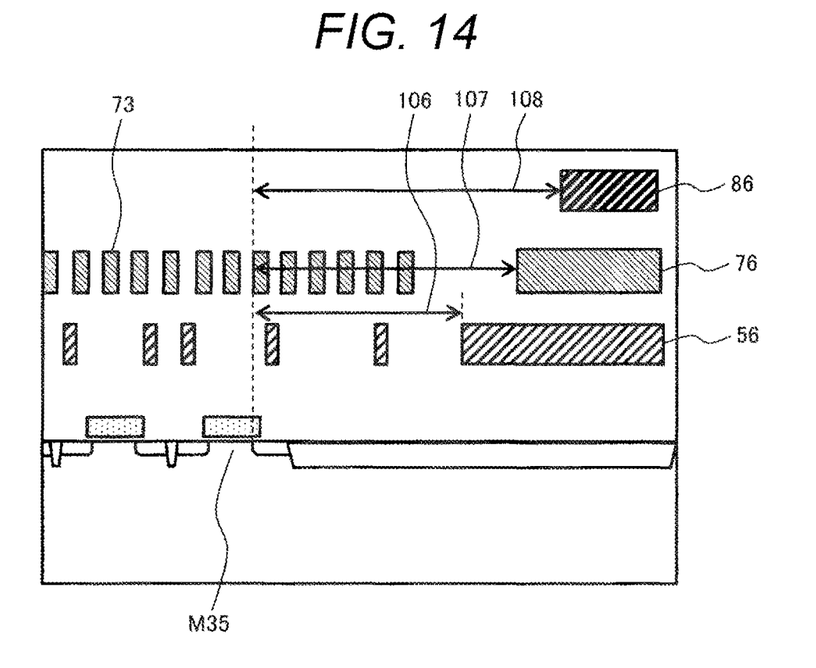
FIG. 14 is a cross-sectional view taken along line E-E' in FIG. 13.

That is, as illustrated in FIGS. 13 and 14, the semiconductor device of this embodiment includes a plurality of peripheral wiring layers 56, 76, and 86 outside the predetermined range R3. The plurality of peripheral wiring layers 56, 76, and 86 are arranged so as to overlap each other when the semiconductor device is viewed in plan view. The peripheral wiring in the upper layer is separated from the end of the channel region of the MOS transistor M35 arranged at the end of the current mirror circuit.

When a plurality of wiring layers are arranged in an overlapping manner, the larger the number of wiring lavers, the greater the influence of strain on the transistor surface due to the wiring. Therefore, the distance 106 from the channel end of the MOS transistor M35 at the right end of the MOS transistor array to the first wiring layer 56, the distance 107 from the channel end of the MOS transistor M35 to the position where two layers, the first wiring layer 56 and the second wiring layer 76, overlap, and the distance 108 from the channel end of the MOS transistor M35 to the position where three layers, the first wiring layer 56, the second wiring layer 76, and the third wiring layer 86, overlap satisfy distance 106<distance 107<distance 108. The influence of strain on to the MOS transistor is suppressed, and the change in electrical characteristics of each MOS is made equal, so that the change in the mirror ratio over time can be suppressed.

Sixth Embodiment

Figure 15:
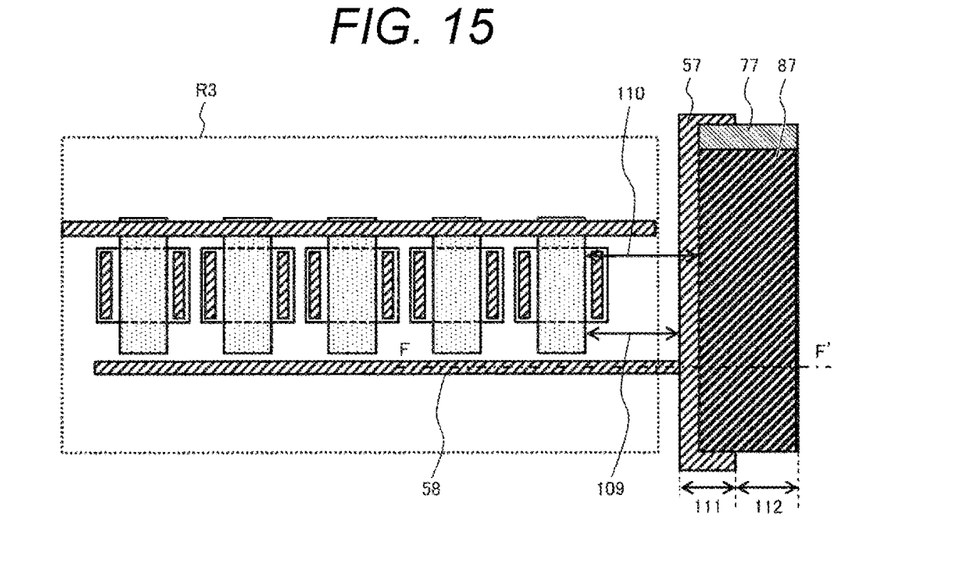
FIG. 15 is a plan view of the semiconductor device according to a sixth embodiment of the invention.

The semiconductor device of a sixth embodiment of the invention will be described with reference to FIGS. 15 and 16. FIG. 15 is a plan view of a semiconductor device to which the invention is applied, and FIG. 16 is a cross-sectional view of the semiconductor device of FIG. 15 cut by F-F'.

Figure 16:
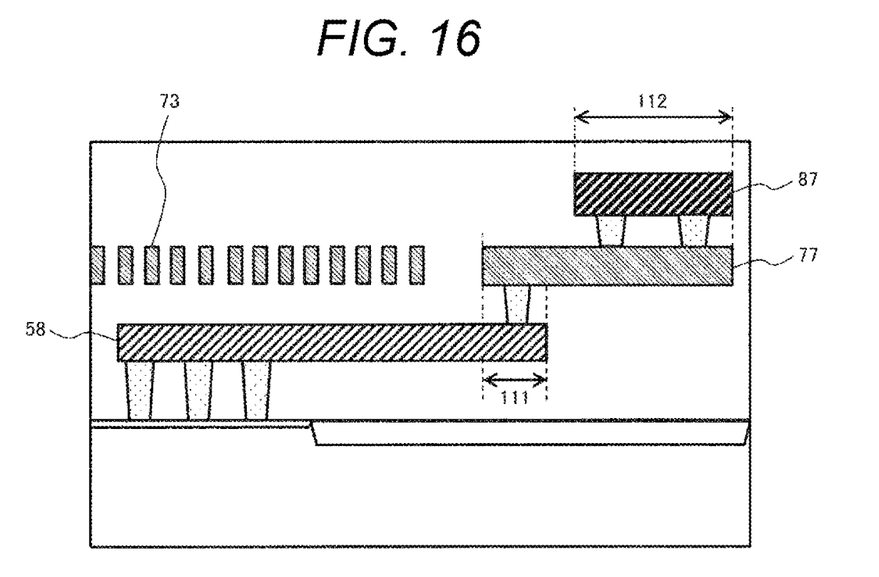
FIG. 16 is a cross-sectional view taken along line F-F' of FIG. 15.

FIGS. 15 and 16 illustrate an example in which a plurality of wiring layers having wide width are used in the periphery of the current mirror circuit as in the fourth and fifth embodiments, and power source lines are arranged in the periphery.

Generally, in a semiconductor device (semiconductor integrated circuit device), it is desirable that the power source line has a low resistance. Therefore, the width of the power source line is wide, and it is configured by a plurality of wiring layers. However, as illustrated in the fourth embodiment and the fifth embodiment, since the strain of the wiring having a wide width and overlapped over a plurality of layers has a larger influence on the transistor surface. Therefore, it is necessary to arrange the wiring away from the current mirror circuit.

Therefore, in this embodiment, as illustrated in FIGS. 15 and 16, the vicinity of the MOS transistor array constituting the current mirror circuit is arranged in a distance 109 where only the first wiring layer 57 and the second wiring layer 77 overlap at a distance (width) indicated by Symbol 111, and it is farther from the region R3 so no influence of strain on the MOS transistor is applied.

The overlapping portion of the second wiring layer 77 and a third wiring layer 87 is set to a width (long distance) 112 wider than the width (distance) 111 (distance 111<distance 112) so as to obtain the required low resistance. A distance 110 to the channel end of the MOS is greater than the distance 109 (distance 109<distance 110). Further, the thin wiring 58 of the first wiring is connected to the current mirror circuit within the range of the region R3.

That is, the semiconductor device of this embodiment includes a power supply wiring configured by the plurality of wiring layers 57, 77, and 87 outside the predetermined range R3, and the power supply wiring is arranged away from the end of the channel region of the MOS transistor which is arranged at the end of the current mirror circuit as the power source line is in the upper layer.

This suppresses the thermal strain that the power source line around the current mirror gives to the MOS transistors that make up the current mirror circuit, and makes the changes in electrical characteristics of each MOS equal, thereby suppressing changes in the mirror ratio over time.

Seventh Embodiment

Figure 17:
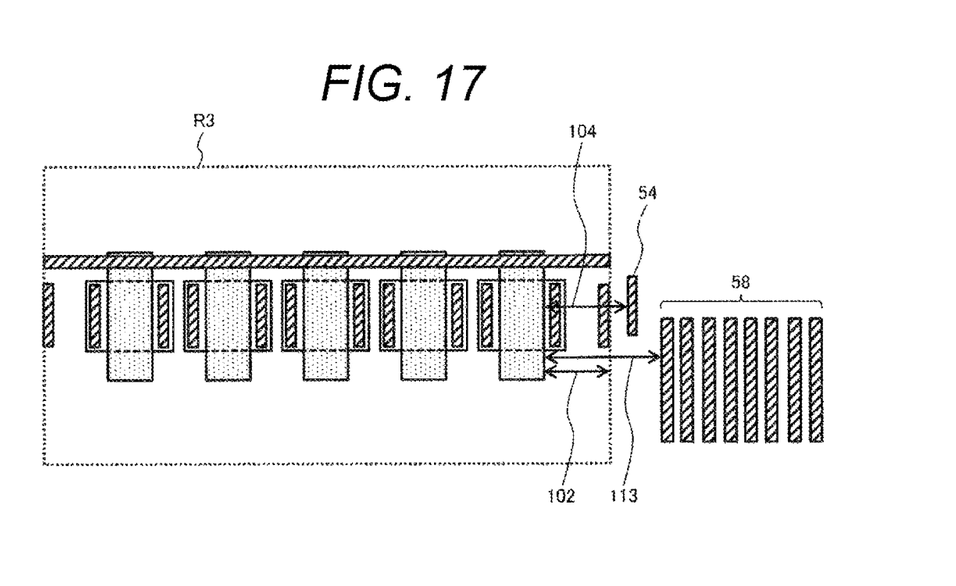
FIG. 17 is a plan view of the semiconductor device according to a seventh embodiment of the invention.

The semiconductor device according to the seventh embodiment of the invention will be described with reference to FIG. 17. FIG. 17 is a plan view of a semiconductor device to which the invention is applied.

In this embodiment, as illustrated in FIG. 17, on the right side of the current mirror circuit of the second embodiment (FIGS. 7 and 8), there are added an isolated wiring 54 having a narrow wiring width in the first wiring layer and a number of wirings 58 which are adjacent with narrow intervals between wirings. Hereinafter, a group of one or more adjacent wirings is referred to as a wiring bundle.

For simplicity, the second wiring layer 73 in the second embodiment (FIGS. 7 and 8) is not illustrated in FIG. 17.

The region R3 in FIG. 17 is the total region in which the regions from each channel of the MOS transistors M31 to M35 to the distance 102 in a plane in FIGS. 7 and 8 are combined.

As illustrated in FIG. 11B described above, the change in strain is large at the end of the wiring region in which a plurality of wirings are arranged. When a large number of thin wirings are arranged at narrow intervals, the larger the total value of the widths of the wirings, the larger the thermal strain at the end of the wiring region. A distance 113 from the channel end of the MOS transistor to the wiring bundle 58 formed in a number of wirings outside the region R3 at narrow intervals is made larger than the distance 102 and the distance 104 described above (distance 102<distance 104<distance 113).

That is, the semiconductor device of this embodiment includes a plurality of peripheral wiring bundles 54 and 58 having different numbers of wirings outside the predetermined range R3. The plurality of peripheral wiring bundles are arranged such that the peripheral wiring bundle having a wide (larger) total wiring width is arranged as the place is farther from the end of the channel region of the MOS transistor arranged at the end of the current mirror circuit.

As a result, the strain received by the MOS transistor array is suppressed from the wiring configured by a large number of wirings and having a large total wiring width, so that the change in electrical characteristics of each MOS are made equal, and the change in the mirror ratio over time can be suppressed.

Eighth Embodiment

Figure 18:
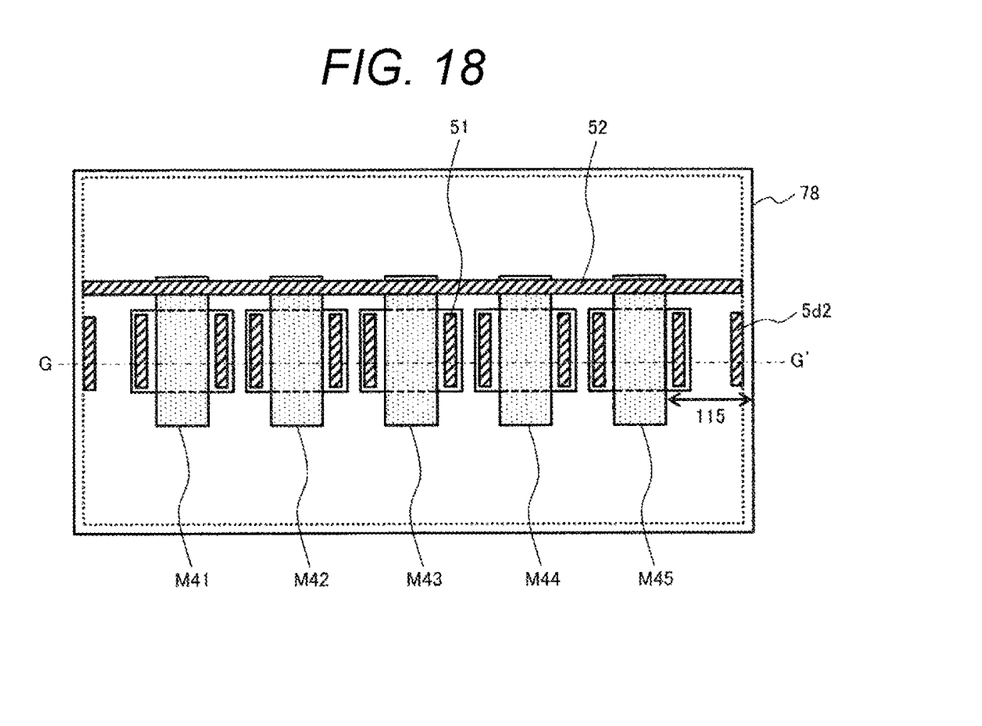
FIG. 18 is a plan view of the semiconductor device according to an eighth embodiment of the invention.
Figure 19:
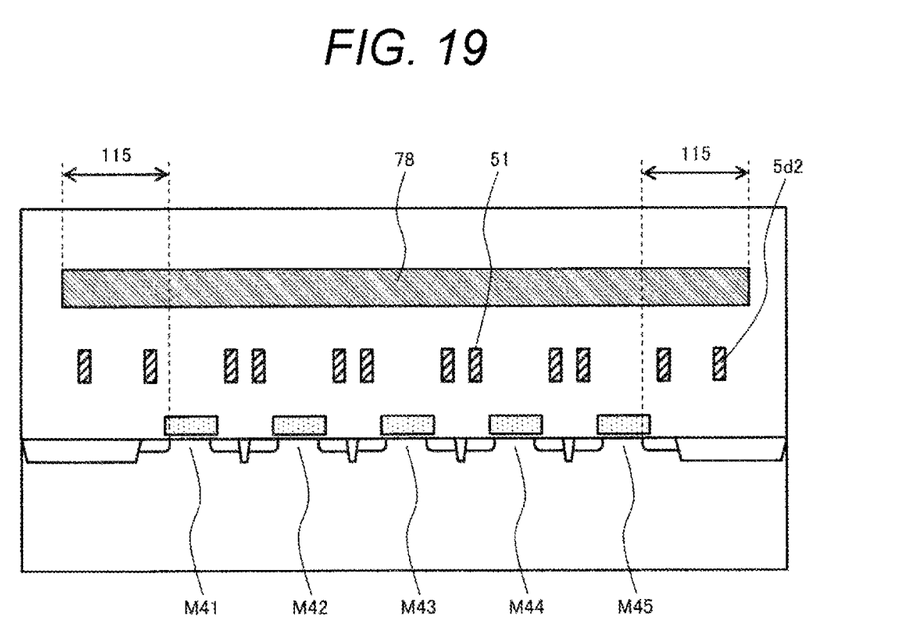
FIG. 19 is a cross-sectional view taken along line G-G' of FIG. 18.

The semiconductor device of the eighth embodiment of the invention will be described with reference to FIGS. 18 and 19. FIG. 18 is a plan view of the semiconductor device to which the invention is applied, and FIG. 19 is a cross-sectional view of the semiconductor device of FIG. 18 cut by G-G'.

In this embodiment, as illustrated in FIG. 18, the current mirror circuit is configured by five MOS transistors M41 to M45. In the first wiring layer on the MOS transistors M41 to M45, a wiring 5d2, which is a dummy wiring, is arranged in addition to the wiring 51 connected to the source terminal and the drain terminal of the MOS transistor and the wiring 52 connected to the gate electrode of each MOS transistor similarly to the second embodiment (FIG. 7) so as to make the strain received from the wiring by each MOS transistor equal. Further, a second wiring layer 78 covers the range from the channel ends of the MOS transistor M41 and the MOS transistor M45 to the distance indicated by Symbol 115 such that the thermal strain received by the MOS transistor M41 and MOS transistor M45 at both ends of the MOS transistor array from the second wiring layer 78 is equivalent to the strain received by the MOS transistors M42 to M44 near the center of the array. Here, the distance 115 is set to a value larger than the region where the change in strain at the wiring end is large.

That is, in the semiconductor device of this embodiment, at least one wiring layer (here, the second wiring layer 78) among the plurality of wiring layers 51 and 78 is arranged to cover the entire surface of a predetermined range when the semiconductor device is viewed in plan view.

As a result, the MOS transistor array suppresses the strain received from the wiring in the upper layer, and the change in electrical characteristics of each MOS are made equal to each other, so that the change in the mirror ratio over time can be suppressed.

Although each of the above embodiments is described when the current mirror circuit and the wiring layer in the peripheral region thereof are two or three layers, the same effect as that of each of the above embodiments can be obtained by applying the same configuration even when there are more wiring layers than each of the above embodiments or there is a wiring layer above the second wiring layer and the third wiring layer.

Further, in each embodiment, the "dummy wiring" is provided to equalize the amount of strain received by each MOS transistor constituting the current mirror circuit, and is assumed as an isolated wiring not connected to any element or a wiring which does not attribute to the operation of the current mirror circuit, but the invention is not limited to this. Needless to say, the effect of the invention can be obtained even with a wiring that contributes to the operation of the current mirror circuit as long as it is a "wiring pattern in which each wiring pattern is arranged so as to have the same shape within a predetermined range".

In addition, the invention is not limited to the above embodiments, but various modifications may be contained.

For example, the above embodiments have been described in detail for easy understanding of the invention, and the invention is not necessarily limited to having all the configurations described. A part of the configuration of a certain embodiment can be replaced with the configuration of another embodiment, and the configuration of another embodiment can be added to the configuration of a certain embodiment. It is possible to add, delete, and replace other configurations for a part of the configuration of each embodiment.

REFERENCE SIGNS LIST 8 transistor surface (of stress simulation model)
51 to 58, 5d, 5d2 first wiring layer
71 to 78, 7d second wiring layer
86, 87 third wiring layer
100 to 115 distance (distance between wirings, wiring width, starting from MOS channel end)
200, 201 distance (starting from the wiring end in the stress simulation result)
M11 to M45 MOS transistor (which makes up the current mirror circuit)
R3, R11 to R34 region (of wiring)

The invention claimed is:

1. A semiconductor device, comprising:
a current mirror circuit that includes a first MOS transistor and a plurality of MOS transistors paired with the first MOS transistor; and
a plurality of wiring layers formed on an upper layer of the MOS transistor,
wherein the plurality of wiring layers are arranged such that wiring patterns have a same shape within a predetermined range from an end of a channel region of each of the first MOS transistor and the plurality of MOS transistors;
wherein a dummy wiring is arranged within the predetermined range from the end of the channel region of the MOS transistor arranged at an end of the current mirror circuit;
wherein the plurality of wiring layers includes a first wiring layer arranged in a layer closest to a layer where the MOS transistor is formed and a second wiring layer arranged in an upper layer of the first wiring layer in wiring layers on the MOS transistor, and
wherein the dummy wiring is arranged in the first wiring layer and the second wiring layer.

2. The semiconductor device according to claim 1, wherein the predetermined range is a range where a distance from the end of the channel region of each MOS transistor is within 5 μm.

3. The semiconductor device according to claim 1, wherein the second wiring layer extends in the same direction as the first wiring layer.

4. The semiconductor device according to claim 1, wherein a wiring forming each wiring pattern and a wiring for connecting a source and a drain of the MOS transistor all have the same shape.

5. The semiconductor device according to claim 1, comprising:
a power source wiring which is configured by a plurality of wiring layers outside the predetermined range,
wherein the power source wiring is arranged away from the end of the channel region of the MOS transistor arranged at the end of the current mirror circuit as the power source wiring is arranged in an upper layer.

6. The semiconductor device according to claim 1, comprising:
a plurality of peripheral wirings that have a different number of wirings outside the predetermined range,
wherein the plurality of peripheral wiring bundles are arranged such that a peripheral wiring bundle having a larger total wiring width is arranged as it is farther from the end of the channel region of the MOS transistor arranged at the end of the current mirror circuit.

7. The semiconductor device according to claim 1, wherein, in the plurality of wiring layers, at least one wiring layer covers the entire surface of the predetermined range when the semiconductor device is viewed in plan view.

8. The semiconductor device according to claim 1, wherein the dummy wiring is an isolated wiring that is not connected to any element, or a wiring that does not contribute to an operation of the current mirror circuit.

9. The semiconductor device according to claim 1, wherein the semiconductor device is an analog integrated circuit device for current control, and
wherein the current mirror circuit is used for current value measurement.

10. An in-vehicle electronic control device including the semiconductor device according to claim 1.

11. A semiconductor device, comprising:
a current mirror circuit that includes a first MOS transistor and a plurality of MOS transistors paired with the first MOS transistor; and
a plurality of wiring layers formed on an upper layer of the MOS transistor,
wherein the plurality of wiring layers are arranged such that wiring patterns have a same shape within a predetermined range from an end of a channel region of each of the first MOS transistor and the plurality of MOS transistors;
wherein a dummy wiring is arranged within the predetermined range from the end of the channel region of the MOS transistor arranged at an end of the current mirror circuit;
a plurality of peripheral wirings that have different wiring widths outside the predetermined range,
wherein the plurality of peripheral wirings are arranged such that a peripheral wiring having a wider width is arranged as it is farther from the end of the channel region of the MOS transistor arranged at the end of the current mirror circuit.

12. A semiconductor device, comprising:
a current mirror circuit that includes a first MOS transistor and a plurality of MOS transistors paired with the first MOS transistor; and
a plurality of wiring layers formed on an upper layer of the MOS transistor,
wherein the plurality of wiring layers are arranged such that wiring patterns have a same shape within a predetermined range from an end of a channel region of each of the first MOS transistor and the plurality of MOS transistors;
wherein a dummy wiring is arranged within the predetermined range from the end of the channel region of the MOS transistor arranged at an end of the current mirror circuit;
a plurality of peripheral wiring layers outside the predetermined range,
wherein the plurality of peripheral wiring layers are arranged so as to overlap each other when the semiconductor device is viewed in plan view, and
wherein the peripheral wiring in an upper layer is arranged away from the end of the channel region of the MOS transistor arranged at the end of the current mirror circuit.

* * * * *